(12) United States Patent
Choi

(10) Patent No.: US 7,960,994 B2
(45) Date of Patent: Jun. 14, 2011

(54) TEST CIRCUIT FOR USE IN A SEMICONDUCTOR APPARATUS

(75) Inventor: Hong-Sok Choi, Ichon (KR)

(73) Assignee: Hynix Semiconductor Inc. (KR)

( * ) Notice: Subject to any disclaimer, the term of this patent is extended or adjusted under 35 U.S.C. 154(b) by 411 days.

(21) Appl. No.: 12/178,484

(22) Filed: Jul. 23, 2008

(65) Prior Publication Data

US 2009/0121733 A1    May 14, 2009

(30) Foreign Application Priority Data

Nov. 9, 2007  (KR) .................. 10-2007-0114122

(51) Int. Cl.
  *G01R 31/02* (2006.01)
  *G01R 31/26* (2006.01)
(52) U.S. Cl. ................................. 324/762.01
(58) Field of Classification Search .............. None
  See application file for complete search history.

(56) References Cited

U.S. PATENT DOCUMENTS

| 5,818,249 | A  | 10/1998 | Momohara |
| 7,212,019 | B2 | 5/2007 | Schneegans et al. |

FOREIGN PATENT DOCUMENTS

| JP | 2005-333128 | 12/2005 |
| JP | 2006-343113 | 12/2006 |
| JP | 2007-003252 | 1/2007 |
| KR | 1019990013060 | 2/1999 |
| KR | 1020050110304 | 11/2005 |
| KR | 1020070057378 | 6/2007 |

*Primary Examiner* — Roberto Velez
(74) *Attorney, Agent, or Firm* — Baker & McKenzie LLP

(57) ABSTRACT

A test circuit that senses a misaligned probe during a test includes a first power control section that senses voltage levels of a plurality of sensing lines and controls power supplied to a lower circuit section provided below a part of a pad group, and a second power control section that selectively provides an internal voltage in response to a sensing result of the first power control section.

8 Claims, 5 Drawing Sheets

US 7,960,994 B2

TEST CIRCUIT FOR USE IN A SEMICONDUCTOR APPARATUS

CROSS-REFERENCES TO RELATED APPLICATION

The present application claims priority under 35 U.S.C. 119(a) to Korean application number 10-2007-0114122, filed on Nov. 9 2007, in the Korean Intellectual Property Office, which is incorporated by reference in its entirety as if set forth in full.

BACKGROUND

1. Technical Field

The embodiments described herein relate to a semiconductor apparatus, and more particularly, to a test circuit that can control power supplied to a lower circuit section provided below a pad and monitor the result thereof even when a test probe is not optimally placed on the pad.

2. Related Art

A conventional process for manufacturing a semiconductor chip includes a fabrication process (FABrication Process; 'FAB' process) that repeatedly forms a specific circuit pattern in order to form an integrated circuit on a semiconductor substrate (wafer), and a test process that tests the characteristics of a semiconductor chip formed on the semiconductor substrate. After that, an assembly process for cutting the semiconductor substrate unit chips and packaging the chips is performed.

In the above-mentioned test process, specifically, a tip (or needle) of a probe card of a tester comes in contact with a pad of the semiconductor chip, and a signal is transmitted to the pad, so that it is possible to determine whether the semiconductor chip has defects or not. However, as the number of pads to be probed increases, it is difficult to accurately position a probe tip for signal transmission at each of the pads. For this reason, the probe tip may not come in contact with a normal portion of the pad, but rather may come in contact with only an edge portion of the pad.

In a conventional chip, a characteristic monitoring circuit section, which can monitor parameter data such as characteristics of voltage and current of an individual device used to operate the semiconductor chip, or an ESD (Electro-Static Discharge) circuit section may be provided below a part of the edge of the pad. If the probe tip is only contacting an edge of the pad, then, e.g., when excessive pressure is applied to the probe tip, the circuit section provided below the pad may be short-circuited to the pad. This can actually cause defects in the chip and/or can result in false test readings. As a result, the yield of the semiconductor chip may be decreased.

SUMMARY

A test circuit for use in a semiconductor apparatus that can be configured to control power supplied to a lower circuit section provided below a pad and to monitor the result thereof even when a test probe is not placed optimally on the pad.

According to one aspect, a test circuit for use in a semiconductor apparatus includes a first power control section that senses voltage levels of a plurality of sensing lines and controls power supplied to a lower circuit section provided below a part of a pad group, and a second power control section coupled with the first power control section, the second power control section configured to selectively provides an internal voltage in response to a sensing result of the first power control section.

The first power control section can include a sensing unit that senses the voltage levels of the plurality of sensing lines and provides a power enable signal, and a power supply unit that provides power to the lower circuit section in response to the power enable signal.

According to another aspect, a test circuit includes a sensing unit that detects voltage levels from a plurality of sensing lines provided below the edge portion of a first pad group, senses a short-circuit between the first pad group and the sensing lines, and provides a power enable signal, a power supply unit coupled with the sensing unit, the power supply unit configured to control power supplied to a lower circuit section provided below the first pad group in response to the power enable signal, and a second power control section coupled with the sensing unit, the second power control section configured to selectively provides a path for a signal transmitted to the second pad group in response to the power enable signal.

According to still another aspect, a semiconductor apparatus includes first and second pad groups that include an edge region surrounding a region to be probed, and a test circuit that senses a short circuit between the first pad group and a plurality of sensing lines by using the plurality of sensing lines provided below a part of the edge region of the first pad group, controls the operation of a specific circuit section, and monitors the specific circuit section.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

When a test circuit according to the embodiments described herein is provided, it is possible to sense whether there is an abnormality related to a probe and/or its placement, to shut off power so that a specific circuit section does not operate, and to monitor the specific circuit section in order to rearrange the probes. That is, by providing sensing lines below a pad group the voltage levels of the sensing lines can be detected, and it is possible to sense whether the sensing lines are short-circuited to the pad, which can indicted an abnormality related to the probe. Further, power can be shut off so that a specific circuit section provided below the pad does not operate when an abnormality is detected, thereby preventing damage. Therefore, it is possible to decrease the occurrence of defects.

Figure 1A:
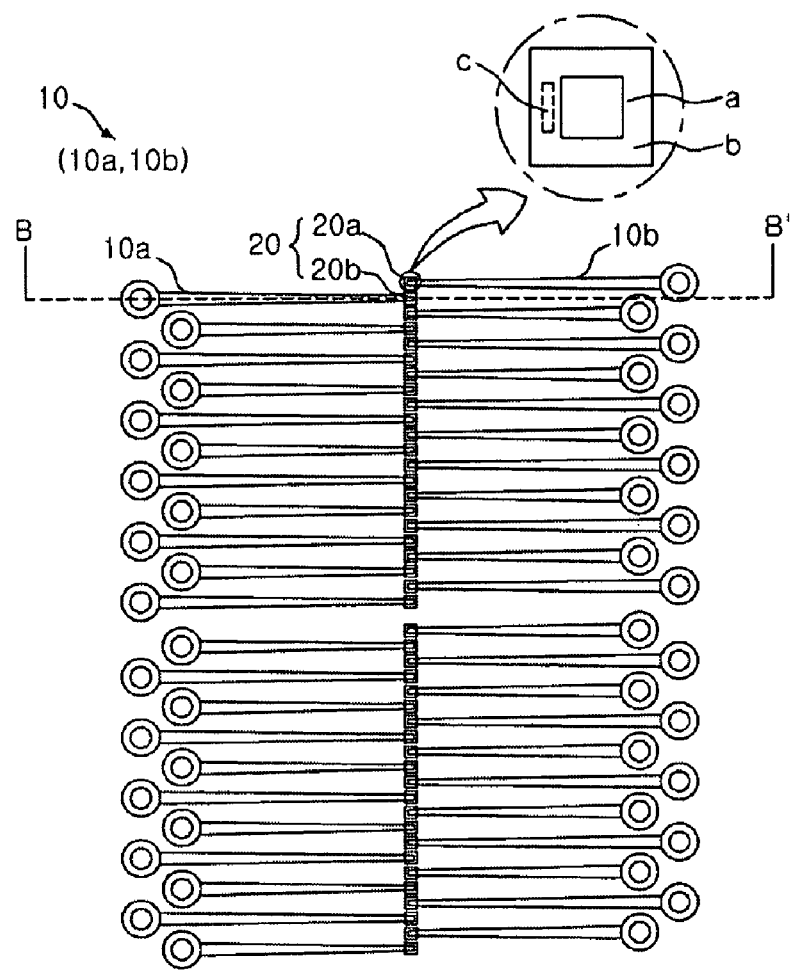
FIG. 1A is a top view of a semiconductor apparatus showing the layout of pads and probe tips that probe the pads.
Figure 1B:
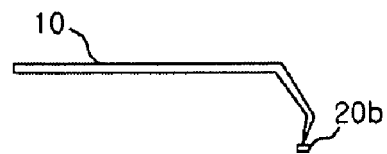
FIG. 1B is a cross-sectional view taken along a line B-B' of FIG. 1A.

FIGS. 1A and 1B are diagrams showing the relationship between probe tips 10 and pads 20 of a semiconductor apparatus. FIG. 1A is a top view showing the layout of the probe tips 10 and the pads 20, and FIG. 1B is a cross-sectional view taken along a line B-B' of FIG. 1A.

Referring to FIGS. 1A and 1B, there are provided a plurality of pads 20a and 20b, a plurality of first probe tips 10a disposed on side of the pads 20 at regular intervals, and a plurality of second probe tips 10b disposed on the other side of the pads 20 at regular intervals.

In detail, the first probe tips 10a are connected to even-numbered rows, i.e., second pad group 20b of the pads 20, and the second probe tips 10b are connected to odd-numbered rows, i.e., a first pad group 20a of the pads 20. Probe tips 10a and 10b disposed adjacent to each other have different lengths to ensure the do not contact each other and to provide an area margin. For example, the first probe tips 10a disposed at the even-numbered rows are composed of short probe tips and long probe tips one after the other as are the second probe tips 10b disposed at the odd-numbered rows.

The ends of the probe tips 10 come in contact with the pads 20 so as to transmit electrical signals.

The physical region of the pad 20 can include a predetermined region (a) where the probe tip 10 comes in contact with the pad and an edge region (b) that surrounds the region. In the example of FIGS. 1A and 1B, the predetermined region (a) is exemplified as a normal region that is probed, but is not physically shown or defined. For the first pad group 20a, a separate lower circuit section (c) can be positioned below the edge region (b) of the pad. The second pad group 20b can, e.g., be a power pad group where a separate circuit section is not provided below the edge region (b) of the pad unlike the first pad group 20a. In this case, the lower circuit section (c) can be an ESD (Electro-Static Discharge) circuit section or a circuit section for monitoring characteristics of a device, but is not limited thereto.

Figure 2:
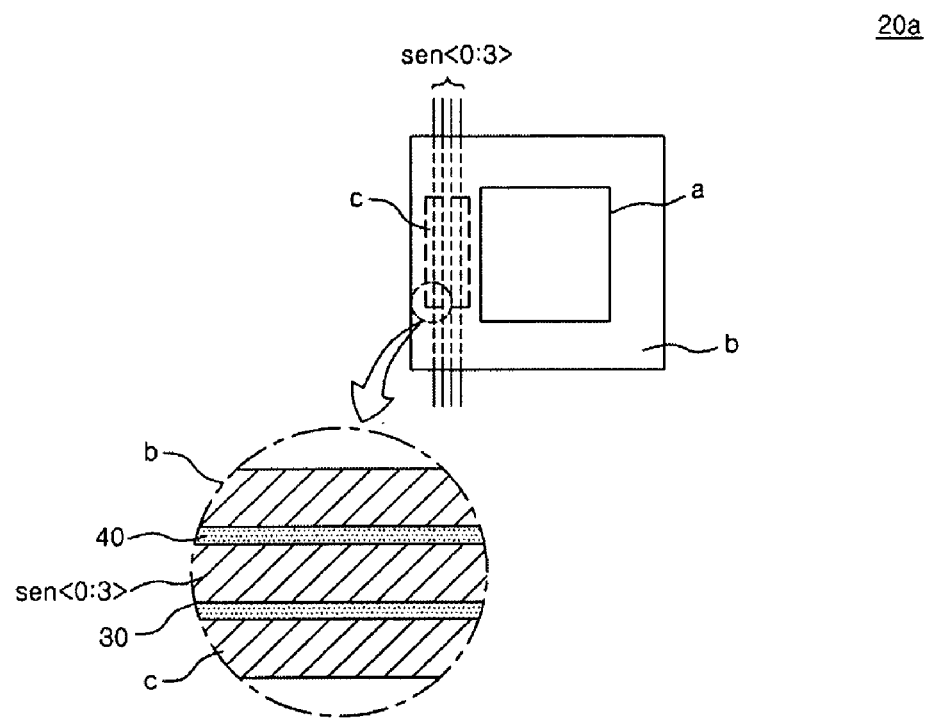
FIG. 2 is a conceptual diagram of a first pad group according to one embodiment.

FIG. 2 is a top view of one of plurality of pads comprising the first pad group 20a according to one embodiment. Referring to FIG. 2, the lower circuit section (c) is provided below a portion of the edge region (b) of the first pad group 20a. First to fourth sensing lines sen<0:3>, which can be configured to sense probe defects, are provided between the lower circuit section (c) and the first pad group 20a.

An example configuration of the edge region (b), the sensing lines sen<0:3>, and the lower circuit section (c) will be roughly described below with reference to the cross-sectional view of FIG. 2.

In more detail, the lower circuit section (c) can be formed of a first metal layer metal 0, and the edge region (b) of the pad can be formed of a pad metal layer, that is, a third metal layer metal 2. For example, the first metal layer can be an under metal layer, and the third metal layer can be a top metal layer. Therefore, the first to fourth sensing lines sen<0:3> can be formed of a second metal layer metal 1 that is different from a pad metal layer and a metal layer of the lower circuit section. Further, in order to prevent the metal layers from being electrically connected to one another, a first interlayer insulating film 30 can be interposed between the lower circuit section (c) and the first to fourth sensing lines sen<0:3>, and a second interlayer insulating film 40 can be interposed between the edge region (b) of the pad and the first to fourth sensing lines sen<0:3>. Accordingly, when the position of a probe tip (see 10 of FIG. 1A) deviates from a normal position (a) and the probe tip comes in contact with the edge region (b) with excessive pressure, the first to fourth sensing lines sen<0:3> can be short-circuited to the edge region (b). Therefore, it is possible to sense whether the position of the probe is off and/or if the position of the probe has the potential to cause a defect, by detecting voltage levels of the first to fourth sensing lines sen<0:3>.

While four sensing lines are exemplified for convenience of description, it will be understood that the number of sensing lines can be increased or decreased as required by a particular implementation. In other words, the embodiments described herein can use more or less sensing lines as long as it s possible to sense whether the position of the probe is off and/or whether the lower circuit section (c) is short-circuited or not.

Figure 3:
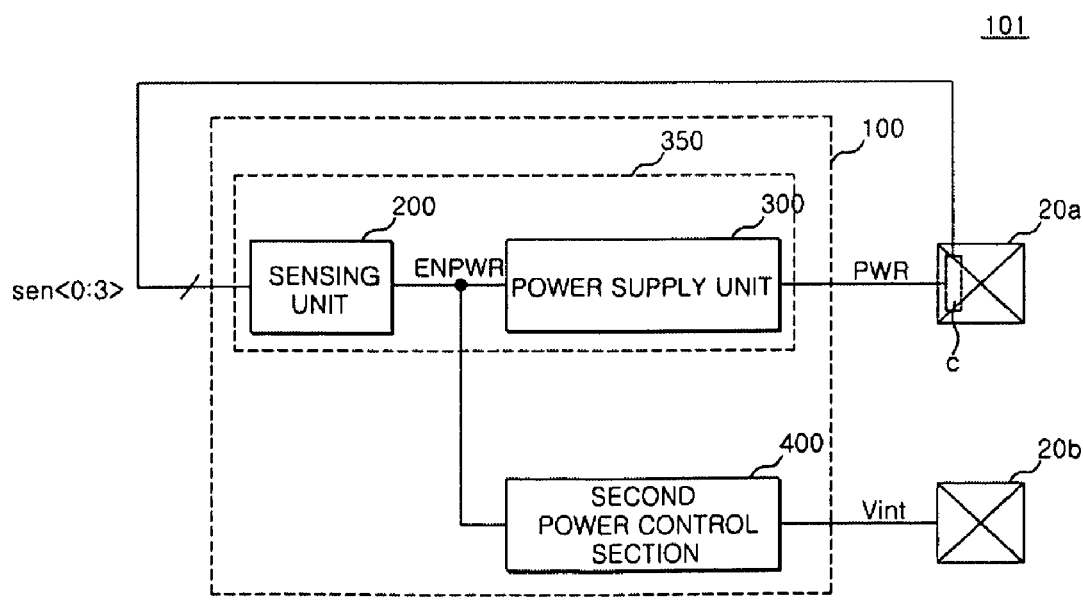
FIG. 3 is a block diagram of a test circuit according to one embodiment.

FIG. 3 is a block diagram of a test circuit 101 according to one embodiment. Referring to FIG. 3, the test circuit 101 includes a power control block 100 that can be configured to control power supplied to pads 20a and 20b.

The power control block 100 can include a first power control section 350 and a second power control section 400.

The first power control section 350 can include a sensing unit 200 and a power supply unit 300 the sensing unit 200 can be configured to sense voltage levels from the first to fourth sensing lines sen<0:3> that are provided below the first pad group 20a, and supply a power enable signal 'ENPWR'.

The power supply unit 300 can be configured to provide power 'PWR' to the lower circuit section (c) of the first pad group 20a in response to the power enable signal 'ENPWR'.

In more detail, the sensing unit 200 can be configured to sense whether the edge region (see (b) of FIG. 2) of the pad and the first to fourth sensing lines sen<0:3> cause a short circuit. If the edge region (b) and the first to fourth sensing lines cause a short circuit, then the sensing unit can deactivated the power enable signal 'ENPWR'. Accordingly, the power supply unit 300 can control whether the power 'PWR' is supplied to the lower circuit section (c) via the power enable signal 'ENPWR'. That is, when it is determined as a result of the test that the probe is not positioned correctly, then power supply unit 300 can prevent the power 'PWR' from being supplied to the lower circuit section (c to decrease the occurrence of defects caused by shorting between the lower circuit section (c) and the probe.

The second power control section 400 can be configured to provide internal voltages Vint, which are signals used for monitoring and are provided through different paths, to the second pad group 20b in response to the power enable signal 'ENPWR'.

As described above, if it is determined by sensing whether the edge region (b) of the pad is short-circuited to any of the first to fourth sensing lines sen<0:3>, then the first power control section 350 can be configured not to supply power to the lower circuit section (c). The first power control section 350 can be connected to a feedback loop and thus self-controlled. The feedback loop can be configured to feedback the process result for the lower circuit section (c). That is, when the probe is incorrectly positioned, power is not supplied to the lower circuit section (c), and the control operation is completed. As a result, it can be difficult to determine in real time with which pads a problem exists.

The second power control section 400 can be configured to monitor the internal voltages Vint that are provided to the second pad group 20b using the power enable signal 'ENPWR', and thereby determine which pads have a problem. This will be described in detail below.

Figure 4:
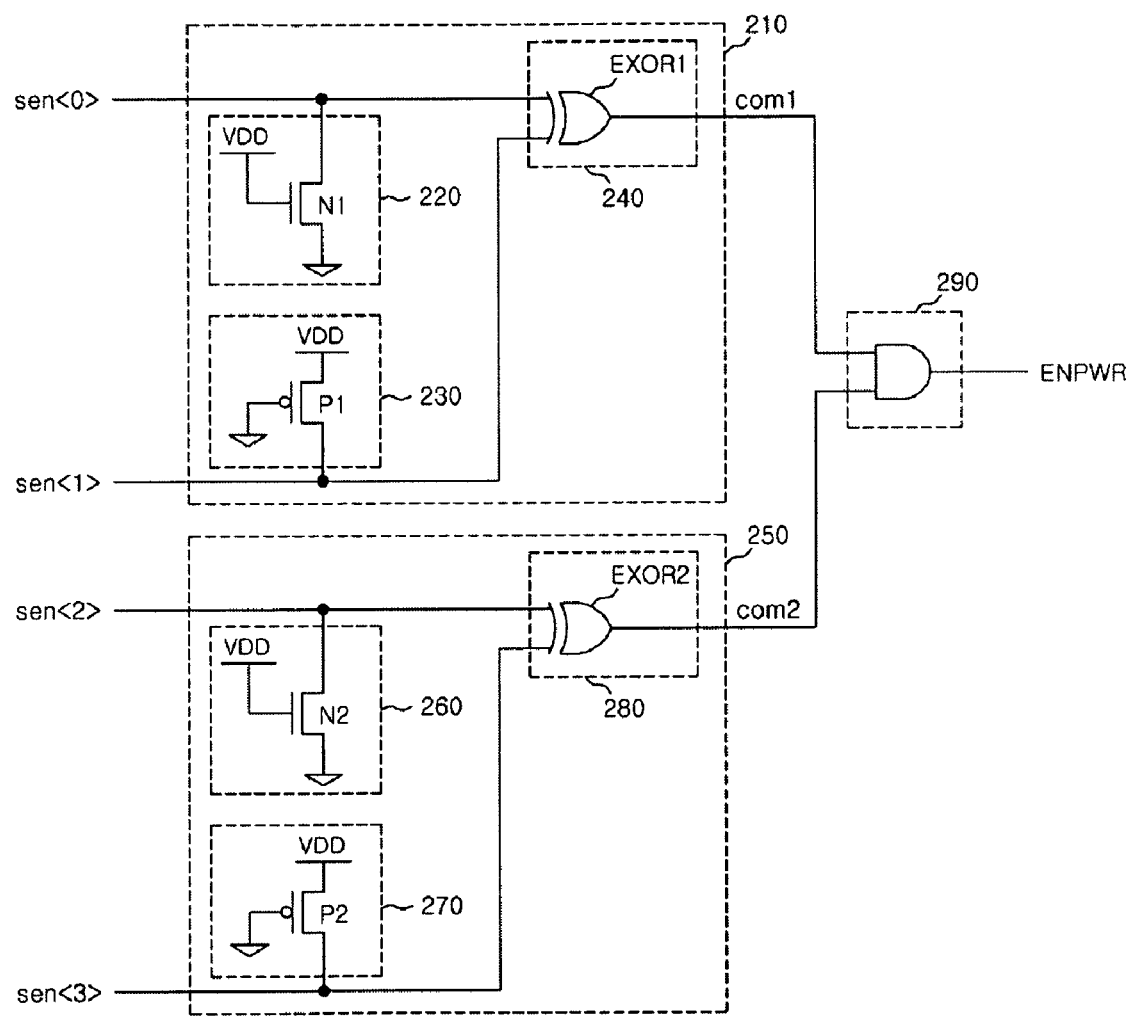
FIG. 4 is a circuit diagram of a sensing unit that can be included in the test circuit shown in FIG. 3.

FIG. 4 is a detailed circuit diagram of the sensing unit 200 shown in FIG. 3. The sensing unit 200 can include a first detection unit 210, a second detection unit 250, and a combination unit 290.

In this case, the first detection unit 210 and the second detection unit 250 can have the same structure and operation principle, but have different input signals. Therefore, for convenience of description, only the first detection unit 210 will be described in detail.

First, the first detection unit 210 can be configured to compare and detect voltages of two adjacent sensing lines sen<0, 1>, and can include a first precharge unit 220, a second precharge unit 230, and a first comparison unit 240.

The first precharge unit 220 can include a first NMOS transistor N1. The first NMOS transistor N1 can include a gate to which external power VDD is applied, a source that is connected to a ground voltage GND, and a drain that is connected to a first sensing line sen<0>. The first NMOS transistor N1 can be turned on by the power VDD that is applied to the gate, and can precharge the first sensing line sen<0> with a low level voltage. In this case, the first NMOS transistor N1 can be a weak transistor, and may be a transistor of which the gate has a long length and a narrow width. Therefore, until the first sensing line sen<0> is short-circuited, the first precharge unit 220 precharges the first sensing line sen<0> with a weak low level voltage.

The second precharge unit 230 can include a first PMOS transistor P1. The first PMOS transistor P1 can include a gate to which the ground voltage GND is applied, a source to which external power VDD is applied, and a drain that is connected to the second sensing line sen<1>. The first PMOS transistor P1 can be turned on by the ground voltage GND that is applied to the gate, and can precharge the second sensing line sen<1> with a high level voltage. Like the above-mentioned first NMOS transistor N1, the first PMOS transistor P1 can be a weak transistor, and can precharge the second sensing line sen<1> with a weak high level voltage.

That is, until the first and second sensing lines sen<0, 1> are physically short-circuited due to external pressure, the first and second precharge units 220 and 230 can be configured to precharge the first and second sensing lines sen<0, 1> so that signal levels of the first and second sensing lines are different from each other.

The first comparison unit 240 can be configured to compare the output results of the first and second precharge units 220 and 230. The first comparison unit 240 can include a first anticoincidence circuit EXOR1. Therefore, depending on an exclusive operation, if the output signals of the first and second precharge units 220 and 230 have a voltage level having the same phase, then the comparison unit 240 can provide first comparison signal 'com1' at a low-level. Further, if the output signals of the first and second precharge units 220 and 230 have voltage levels having different phases, then the comparison unit 240 can provide the first comparison signal 'com1' at a high-level.

The combination unit 290 can be configured to provide an activated high-level power enable signal 'ENPWR' when both the first and second comparison signals com1 and com2, which are the output signals of the first and second detection units 210 and 250, are both at a high-level.

The detailed operation of the sensing unit 200 will now be described with reference to FIG. 4.

First, the operation will be described for the case where the sensing lines are short-circuited to the edge region (b) of the pad due to the incorrect positioning of the probe and excessive pressure placed on the probe.

It should be noted that a diameter of an end-point of a probe tip (see 10 of FIG. 1A) is on the order of several tens of micrometers, and a diameter of each of the first to fourth sensing lines sen<0:3> is in the order of several micrometers. Therefore, when the probe tip (see 10 of FIG. 1A) is short-circuited to the first to fourth sensing lines sen<0:3> due to excessive pressure, then in fact at least two adjacent sensing lines will be short-circuited with each other and with the edge region (see 20 of FIG. 1A) of the pad. Therefore, the two adjacent sensing lines will have the same high-or low-level electric potential.

As an example, it can be assumed for the discussion that follows that the first and second sensing lines sen<0, 1> are short-circuited to the edge region (b), and have the same high-level electric potential.

The first and second sensing lines sen<0, 1> are precharged with different voltage levels. However, once they are shorted, the first and second sensing lines have the same electric potential. Specifically, since each of the first and second precharge units 220 and 230 is a weak transistor, the output signals of the first and second precharge units 220 and 230 vary depending on the first and second sensing lines sen<0, 1> to which signals are input. Therefore, since the same high-level signal is input to the comparison unit 240, the first comparison signal 'com1' output from the first comparison unit 240 becomes a low-level signal.

Considering the combination of the results of the first and second detection units 210 and 250, when any one of the first and second detection units receives a low-level comparison signal, the combination unit 290 provides a low-level power enable signal 'ENPWR'.

That is, if the sensing lines are short-circuited to the edge region of the pad, then the sensing unit 200 provides a deactivated, low-level power enable signal 'ENPWR'.

In contrast, when the sensing lines sen<0:3> are not short-circuited to the edge region of the pad, then due to the first to fourth precharge units 220, 230, 260, and 270, the first to fourth sensing lines sen<0:3> correspond to a low level signal, a high level signal, a low level signal, and a high level signal, respectively, so that two adjacent sensing lines correspond to different level signals. Accordingly, first and second high-level comparison signals 'com1' and 'com2' are provided to the first and second detection units 210 and 250. Since the combination unit 290 receives the first and second high-level comparison signals 'com1' and 'com2', the combination unit 290 can provide an activated, high-level power enable signal 'ENPWR'.

Figure 5:
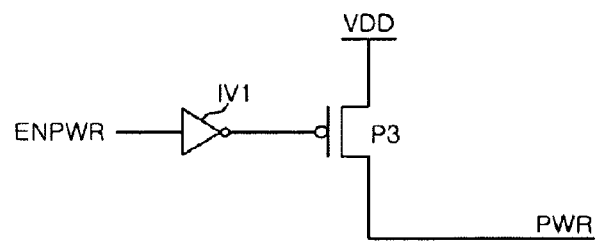
FIG. 5 is a circuit diagram of a power supply unit that can be included in the test circuit shown in FIG. 3.

FIG. 5 is a circuit diagram of the first power supply unit 300 shown in FIG. 3. As can be seen, the power supply unit 300 can include a first inverter IV1 and a third PMOS transistor P3.

The first inverter IV1 can receive and invert the power enable signal 'ENPWR'. The third PMOS transistor P3 can include a gate that receives the power enable signal 'ENPWR', a source to which power VDD is applied, and a drain that is connected to the power signal 'PWR'. Accordingly, the third PMOS transistor P3 can be turned on in response to the inverted power enable signal 'ENPWR'.

That is, when receiving a deactivated low-level power enable signal 'ENPWR', the power supply unit 300 can be configured to shut off the power signal 'PWR' supplied to the pad lower circuit section (c). However, when receiving an activated high-level power enable signal 'ENPWR', the power supply unit 300 can be configured to supply the power signal 'PWR' to the pad lower circuit section (c).

As described above, the first power control section 350 can be configured to sense that the pad is probed with excessive pressure, feed back an indication that such is the case, and supply power 'PWR' to the lower circuit section (c) provided below the pad or shuts off the power 'PWR', so that it is possible to reduce the defects caused by excessive pressure On the probe when it is misaligned.

Figure 6:
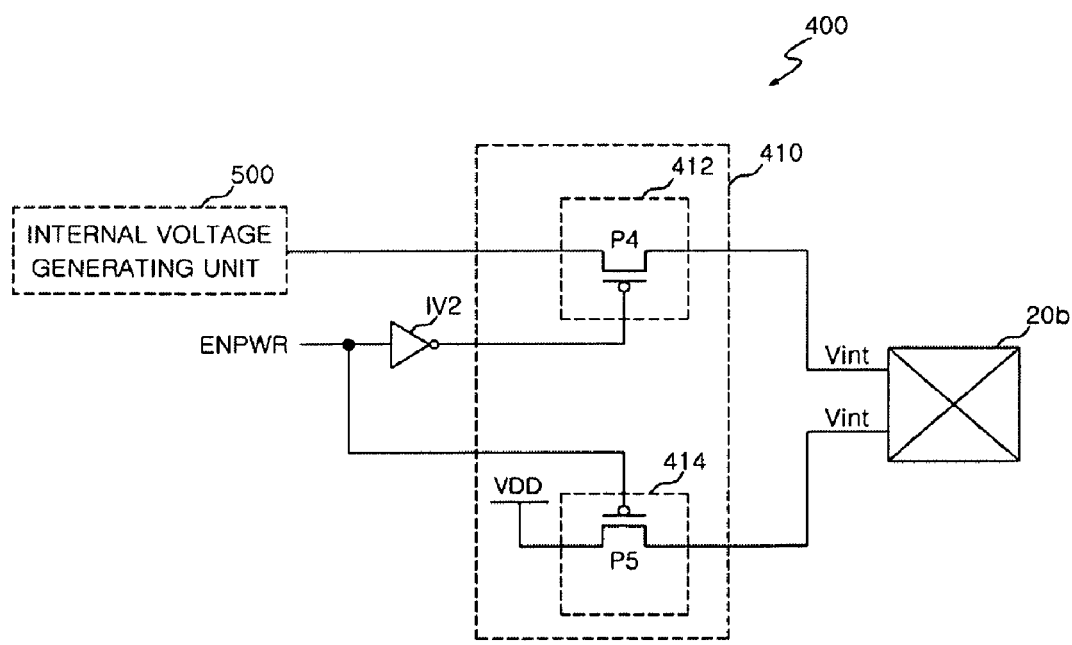
FIG. 6 is a circuit diagram of a second power control section that can be included in the test circuit shown in FIG. 3.

FIG. 6 is a detailed circuit diagram of the second power control section 400. As can be seen, the second power control section 400 can be configured to monitor whether the probe is misaligned using the second pad group 20b. Specifically, the second power control section 400 can provide a voltage, which is provided from an internal voltage generating unit 500, as an internal voltage Vint in accordance with the signal level of the input power enable signal 'ENPWR', or can provide the voltage VDD, which is provided from the outside, as an internal voltage Vint. As described above, the second pad group 20b is exemplified as a power pad group.

Referring to FIG. 6, the second power control section 400 can include a voltage selection unit 410. The voltage selection unit 410 can include first and second switching units 412 and 414.

When being turned on in response to a power enable signal 'ENPWR' that is inverted by a second inverter IV2, the first switching unit 412 can provide the output voltage of the internal voltage generating unit 500 as an internal voltage Vint.

The first switching unit 412 can include a fourth PMOS transistor P4. The fourth PMOS transistor P4 can include a gate that receives the inverted power enable signal 'ENPWR', a source that is connected to the internal voltage generating unit 500, and a drain that is connected to the second pad group 20b.

When turned on in response to the power enable signal 'ENPWR', the second switching unit 414 can provide power VDD, which is supplied from the outside, as an internal voltage Vint. The second switching unit 414 can include a fifth PMOS transistor P5. The fifth PMOS transistor P5 can include a gate that receives the power enable signal 'ENPWR', a source to which the voltage VDD is applied, and a drain that is connected to the second pad group 20b.

The operation of the second power control section 400 will now be described.

When receiving the activated power enable signal 'ENPWR', the first switching unit 412 can be turned on and can provide the voltage, which is output from the internal voltage generating unit 500, as the internal voltage Vint. In this case, if monitoring the voltage from the second pad group 20b, a stable voltage level supplied from the internal voltage generating unit 500 is monitored regardless of the power VDD.

However, when receiving the deactivated power enable signal 'ENPWR', the second switching unit 414 can be turned on and directly provide the power VDD, as the internal voltage Vint. In this case, if monitoring the voltage from the second pad group 20b, it is possible to monitor a voltage level that is increased along the power VDD.

That is, the second power control section 400 can selectively provide a supply path of the internal voltage Vint in accordance with the signal level of the power enable signal 'ENPWR', and can sense whether a problem with the probe exists by measuring the voltage level through the second pad group 20b. Therefore, when the probe is misaligned and the probe comes in contact with the pad with excessive pressure, it is possible to stop the test and realign the probe tips (see 10 of FIG. 1A) by using the monitoring result.

Figure 7:
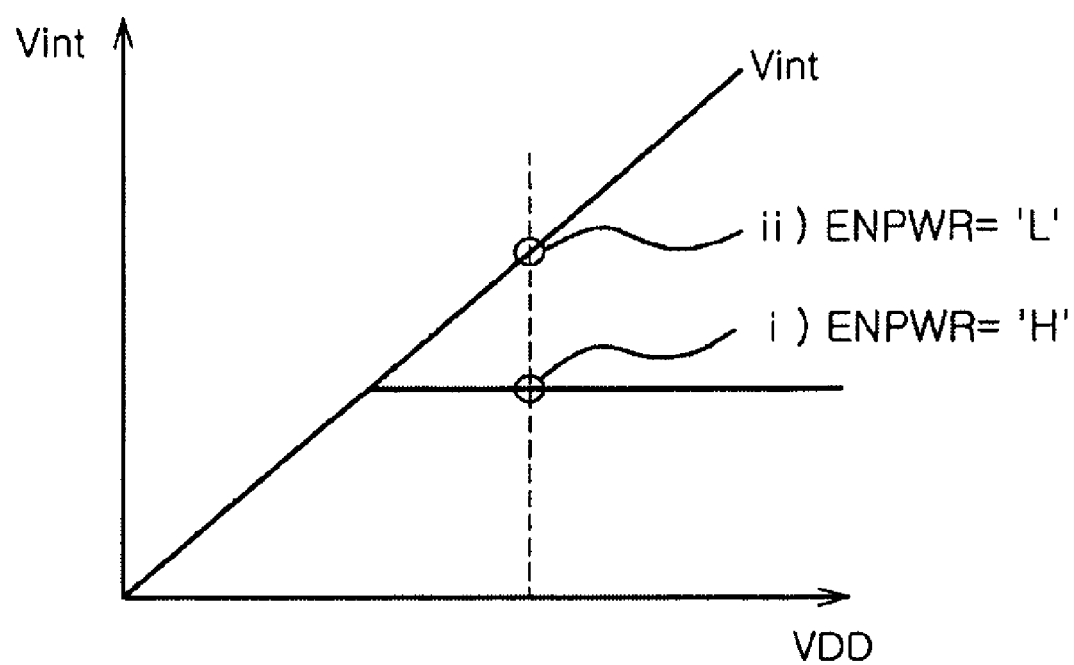
FIG. 7 is a graph showing an output signal of the second power control section shown in FIG. 6.

FIG. 7 is a graph showing a measurement result of the voltage level at the second pad group 20b shown in FIG. 6.

Referring to FIG. 7, as described above, (i) when the power enable signal 'ENPWR' is an activated high-level signal, it can be seen that a stable voltage level where the voltage level measured from the second pad group 20b is maintained constant regardless of the power VDD that is supplied by the internal voltage generating unit (see 500 of FIG. 6) is measured. However, (ii) when the power enable signal 'ENPWR' is a deactivated low-level signal, it can be seen that the voltage level measured from the second pad group 20b does not have a stable range and an internal voltage Vint proportional to the voltage VDD is measured.

Thus, by using a test circuit configured according to the embodiments described herein, it is possible to sense whether probe misalignment occurs, to shut off power so that a specific circuit section does not operate when misalignment occurs, and to monitor the specific circuit section in order to rearrange the probes.

It will be apparent to those skilled in the art that various modifications and changes may be made without departing from the scope and spirit of the embodiments described herein. Therefore, it should be understood that the above embodiments are not limitative, but illustrative in all aspects. The scope of the above embodiments are defined by the appended claims rather than by the description preceding them, and therefore all changes and modifications that fall within metes and bounds of the claims, or equivalents of such metes and bounds are therefore intended to be embraced by the claims.

What is claimed is:

1. A test circuit comprising:
   a first power control section configured to sense voltage levels of a plurality of sensing lines and to control power supplied to a lower circuit section provided below a part of a pad group; and
   a second power control section coupled with the first power control section, the second power control section configured to selectively provide an internal voltage in response to a sensing result of the first power control section.

2. The test circuit of claim 1, wherein the first power control section comprises:
   a sensing unit configured to determine whether the plurality of sensing lines is short-circuited by detecting and comparing the voltage levels of the plurality of sensing lines, and to provide a power enable signal; and
   a power supply unit coupled with the sensing unit, the power supply unit configured to provide power to the lower circuit section in response to the power enable signal.

3. The test circuit of claim 2, wherein the sensing unit comprises:
   a plurality of detection units each configured to detect and compare signal levels of two adjacent sensing lines and to output a signal based thereon; and
   a combination unit coupled with the plurality of detection units, the combination unit configured to provide an activated power enable signal when all of the signals output from the plurality of detection units are activated.

4. The test circuit of claim 3, wherein each of the plurality of the detection units comprise:
   first and second precharge units configured to precharge the adjacent sensing lines with different voltage levels; and
   a comparison unit configured to compare signal levels of the adjacent sensing lines.

5. The test circuit of claim 4, wherein the first and second precharge units are configured to precharge the adjacent sensing lines with a ground voltage and a voltage that is supplied from the outside, respectively.

6. The test circuit of claim 4, wherein if the signal levels of the sensing lines are equal to each other, then the comparison unit is configured to provide a low-level comparison signal.

7. The test circuit of claim 2, wherein the power supply unit provides a voltage, which is supplied from the outside, in response to the power enable signal.

8. The test circuit of claim 1, wherein further comprising an internal voltage generating circuit; and wherein the first power control section is further configured to generate a power enable signal based on the voltage levels of a plurality of sensing lines, and wherein the second power control section comprises:

a first switching unit configured to provide a voltage signal generated by the internal voltage generating circuit as the internal voltage when the power enable signal is activated; and a second switching unit configured to provide external power as the internal voltage when the power enable signal is deactivated.

* * * * *